(12) United States Patent
Lilak et al.

(10) Patent No.: US 11,569,238 B2
(45) Date of Patent: Jan. 31, 2023

(54) VERTICAL MEMORY CELLS

(71) Applicant: Intel Corporation, Santa Clara, CA (US)

(72) Inventors: Aaron Lilak, Beaverton, OR (US); Willy Rachmady, Beaverton, OR (US); Gilbert Dewey, Beaverton, OR (US); Kimin Jun, Portland, OR (US); Hui Jae Yoo, Portland, OR (US); Patrick Morrow, Portland, OR (US); Sean T. Ma, Portland, OR (US); Ahn Phan, Beaverton, OR (US); Abhishek Sharma, Hillsboro, OR (US); Cheng-Ying Huang, Hillsboro, OR (US); Ehren Mannebach, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 898 days.

(21) Appl. No.: 16/222,940

(22) Filed: Dec. 17, 2018

(65) Prior Publication Data
US 2020/0194435 A1      Jun. 18, 2020

(51) Int. Cl.
| H01L 29/66 | (2006.01) |
| H01L 21/336 | (2006.01) |
| H01L 27/108 | (2006.01) |
| H01L 49/02 | (2006.01) |
| H01L 29/423 | (2006.01) |
| H01L 23/528 | (2006.01) |

(Continued)

(52) U.S. Cl.
CPC ...... *H01L 27/10805* (2013.01); *H01L 23/528* (2013.01); *H01L 27/10858* (2013.01); *H01L 27/10873* (2013.01); *H01L 28/60* (2013.01); *H01L 29/0676* (2013.01); *H01L 29/1037* (2013.01); *H01L 29/41733* (2013.01); *H01L 29/41741* (2013.01); *H01L 29/42392* (2013.01); *H01L 29/4908* (2013.01); *H01L 29/517* (2013.01); *H01L 29/66742* (2013.01); *H01L 29/78642* (2013.01)

(58) Field of Classification Search
CPC ............. H01L 29/78642; H01L 27/10805
USPC ............. 438/212, 268–273; 257/135, 329
See application file for complete search history.

(56) References Cited

U.S. PATENT DOCUMENTS

| 11,393,927 B2 * | 7/2022 | Lajoie ............... H01L 29/78684 |
| 11,417,770 B2 * | 8/2022 | Sharma ............... H01L 29/458 |

(Continued)

*Primary Examiner* — Calvin Lee
(74) *Attorney, Agent, or Firm* — Schwabe, Williamson & Wyatt, P.C.

(57) ABSTRACT

Embodiments herein describe techniques for a semiconductor device including a memory cell vertically above a substrate. The memory cell includes a metal-insulator-metal (MIM) capacitor at a lower device portion, and a transistor at an upper device portion above the lower device portion. The MIM capacitor includes a first plate, and a second plate separated from the first plate by a capacitor dielectric layer. The first plate includes a first group of metal contacts coupled to a metal electrode vertically above the substrate. The first group of metal contacts are within one or more metal layers above the substrate in a horizontal direction in parallel to a surface of the substrate. Furthermore, the metal electrode of the first plate of the MIM capacitor is also a source electrode of the transistor. Other embodiments may be described and/or claimed.

20 Claims, 12 Drawing Sheets

(51) Int. Cl.
*H01L 29/786* (2006.01)
*H01L 29/06* (2006.01)
*H01L 29/49* (2006.01)
*H01L 29/10* (2006.01)
*H01L 29/417* (2006.01)
*H01L 29/51* (2006.01)

(56) References Cited

U.S. PATENT DOCUMENTS

2020/0194434 A1* 6/2020 Alzate Vinasco .. H01L 21/8221
2020/0411520 A1* 12/2020 Lajoie ................. H01L 27/1085

* cited by examiner

VERTICAL MEMORY CELLS

FIELD

Embodiments of the present disclosure generally relate to the field of integrated circuits, and more particularly, to memory arrays.

BACKGROUND

Memory devices are important parts of integrated circuits (IC) and modern electronic devices. A memory device, e.g., a dynamic random access memory (DRAM) array, may include a plurality of memory cells, where a memory cell may include a selector, e.g., a transistor, to control the access to a storage cell. When a silicon transistor is used as a selector, the silicon transistor may be very leaky, which may bring adverse impact to the performance of the storage cell.

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs in the back-end, while leaving the silicon substrate areas for high-speed transistors. A TFT may be used as a selector for a memory cell in a memory device, e.g., a DRAM device. However, current designs and implementations of memory devices, e.g., DRAM devices, still face many challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1B:
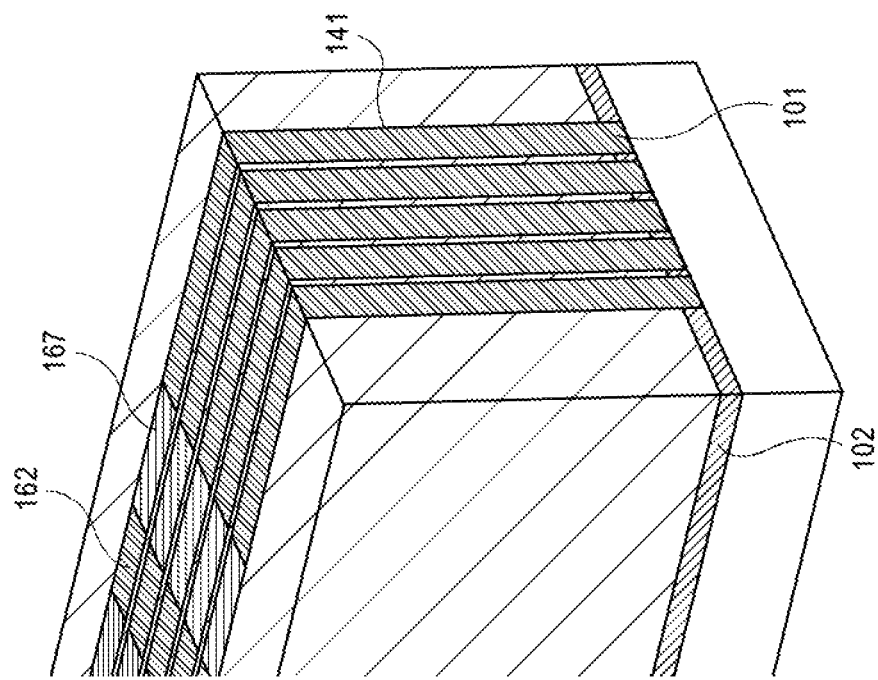
FIGS. 1(a)-1(c) schematically illustrate diagrams of a semiconductor device including memory cells vertically above a substrate, a memory cell including a transistor and a metal-insulator-metal (MIM) capacitor with a shared vertical metal electrode, in accordance with some embodiments.

A memory array, e.g., a dynamic random access memory (DRAM), or an enhanced dynamic random access memory (eDRAM), may include a plurality of memory cells, wherein a memory cell may include a selector, e.g., a transistor, to control the access to a storage cell. In embodiments, the storage cell may be a capacitor to store charge, resulting in a 1T1C (one transistor, one capacitor) architecture for the memory cell. Memory devices may be implemented with deep trench capacitors, or capacitor over bit (COB). However, such implementations of memory devices may still occupy considerable area due to spatial or volume requirements of the capacitors.

Embodiments herein may present a memory device including memory cells with spatially efficient layouts. A memory cell is vertically above a substrate, where the memory cell includes a metal-insulator-metal (MIM) capacitor at a lower device portion, and a transistor at an upper device portion above the lower device portion. As a result, the transistor and the MIM capacitor are self-aligned that a shadow of the transistor substantially overlaps with the MIM capacitor. Accordingly, a memory cell is placed within the footprint of a traditional transistor. Therefore, embodiments herein may provide considerable density savings, e.g., approximately 10 times or 20 times savings, as compared to other conventional implementations. Furthermore, embodiments herein may enable the formation of very large capacitance structures through engineering of the capacitor dielectric and the use of additional metal layers. In some embodiments, the memory cell may include a nanowire or nanoribbon transistor.

Embodiments herein may present a semiconductor device including a memory cell vertically above a substrate. In detail, the memory cell includes a MIM capacitor at a lower device portion, and a transistor at an upper device portion above the lower device portion. The MIM capacitor includes a first plate, and a second plate separated from the first plate by a capacitor dielectric layer. The first plate includes a first group of metal contacts coupled to a metal electrode vertically above the substrate. The first group of metal contacts are within one or more metal layers above the substrate in a horizontal direction in parallel to a surface of the substrate. The second plate includes a second group of metal contacts placed within one or more metal layers above the substrate in the horizontal direction. Furthermore, the metal electrode of the first plate of the MIM capacitor is also a source electrode of the transistor. In addition, the transistor includes a gate electrode around one or more channel areas and coupled to a word line, and a drain electrode coupled to a bit line.

Embodiments herein may present a method for forming a semiconductor device. The method includes forming a first group of metal layers in a horizontal direction in parallel to a surface of a substrate at a lower device portion above the substrate. Any two metal layers of the first group of metal layers are separated by at least an insulating layer. In addition, the method includes forming a second group of channel layers in the horizontal direction at an upper device portion above the lower device portion. Similarly, any two channel layers of the second group of channel layers are separated by at least an insulating layer. Afterwards, the method includes forming one or more fins through the lower device portion and the upper device portion. A fin of the one or more fins includes a first group of metal contacts within the first group of metal layers, and a second group of channel areas within the second group of channel layers. Moreover, for a fin of the one or more fins, the method includes forming a gate electrode around the second group of channel areas at the upper portion, and separated from the second group of channel areas by a gate dielectric layer. In addition, the method includes forming a metal electrode vertically above the substrate and coupled to the first group of metal contacts at the lower device portion to be a first plate of a MIM capacitor, and coupled to the second group of channel areas at the upper device portion as a source electrode for a transistor. The method also includes forming a second plate of the capacitor, where the second plate includes a second group of metal contacts placed within one or more metal layers of the first group of metal layers above the substrate in the horizontal direction. The second plate is separated from the first plate by a capacitor dielectric layer.

Embodiments herein may present a computing device, which may include a circuit board, and a memory device coupled to the circuit board and including a memory array. In more detail, the memory array may include a plurality of memory cells vertically above a substrate. A memory cell of the plurality of memory cells includes a MIM capacitor at a lower device portion, and a transistor at an upper device portion above the lower device portion. The MIM capacitor includes a first plate, and a second plate separated from the first plate by a capacitor dielectric layer. The first plate includes a first group of metal contacts coupled to a metal electrode vertically above the substrate. The first group of metal contacts are within one or more metal layers above the substrate in a horizontal direction in parallel to a surface of the substrate. The second plate includes a second group of metal contacts placed within one or more metal layers above the substrate in the horizontal direction. Furthermore, the metal electrode of the first plate of the MIM capacitor is also a source electrode of the transistor. In addition, the transistor includes a gate electrode around one or more channel areas and coupled to a word line, and a drain electrode coupled to a bit line.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Front-end-of-line (FEOL) semiconductor processing and structures may refer to a first portion of integrated circuit (IC) fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin-film transistor (TFT) is a kind of field-effect transistor formed at BEOL and including a channel layer, a gate electrode, and source and drain electrodes, over a supporting but non-conducting substrate.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations, the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1A:
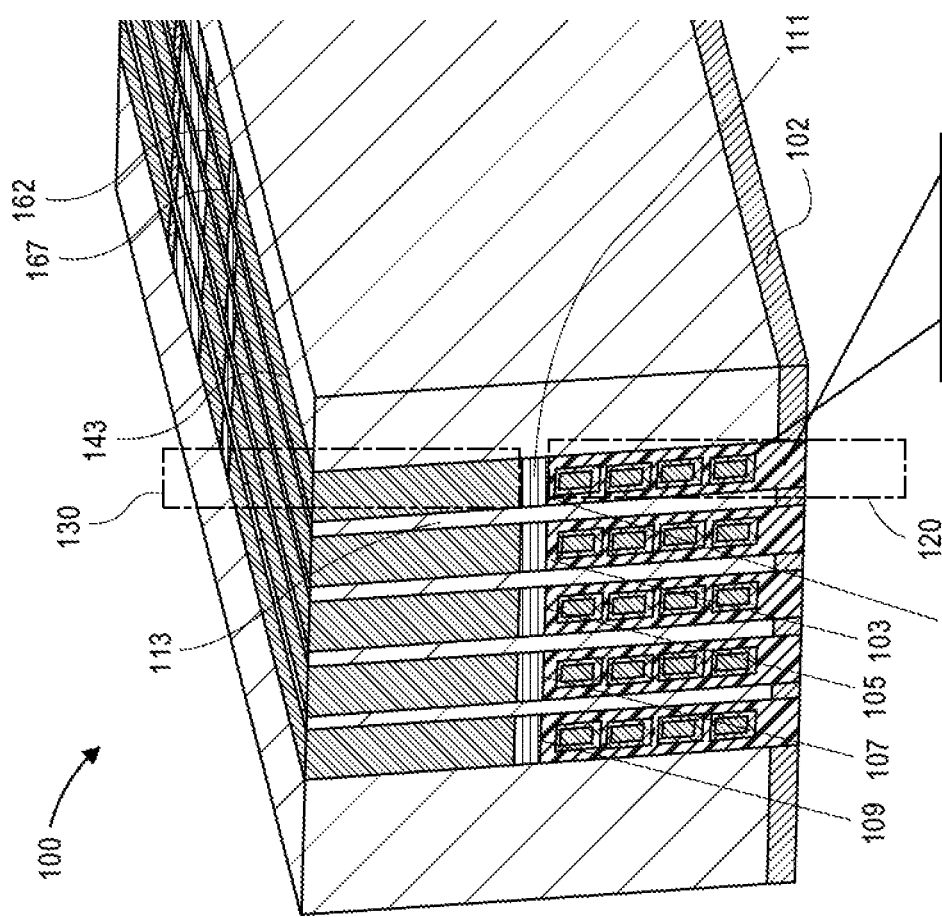
Figure 1C:
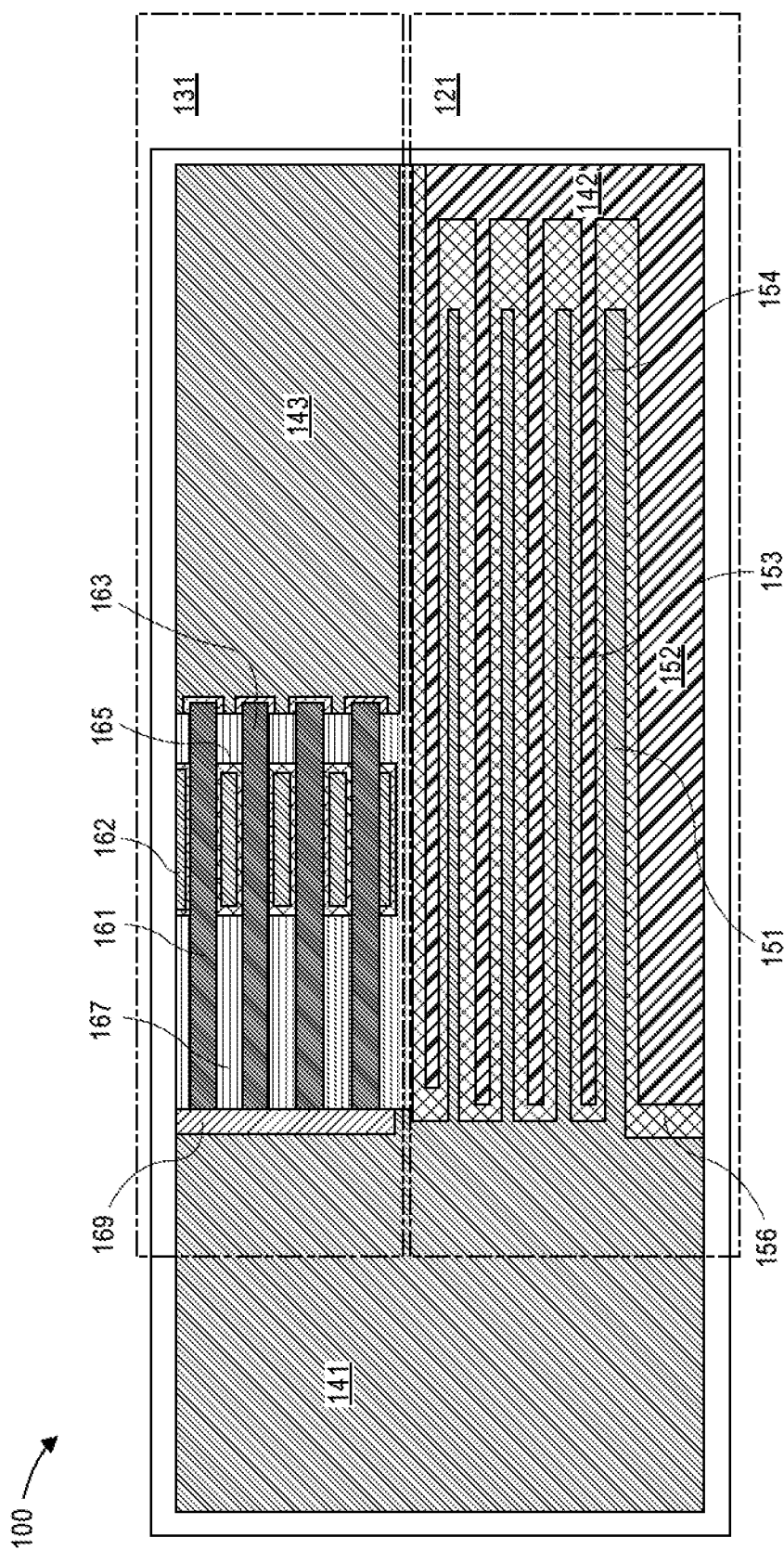

FIGS. 1(a)-1(c) schematically illustrate diagrams of a semiconductor device 100 including memory cells vertically above a substrate 102, a memory cell 101 including a transistor 131 and a MIM capacitor 121 with a shared vertical metal electrode 141, in accordance with some embodiments. For clarity, features of the semiconductor device 100, the substrate 102, the memory cell 101, the transistor 131, the MIM capacitor 121, and the metal electrode 141, may be described below as examples for understanding an example semiconductor device including memory cells vertically above a substrate, a memory cell including a transistor and a MIM capacitor with a shared vertical metal electrode. It is to be understood that there may be more or fewer components within a semiconductor device, a substrate, a memory cell, a transistor, a MIM capacitor, and a metal electrode. Further, it is to be understood that one or more of the components within a semiconductor device, a memory cell, a transistor, a MIM capacitor, and a metal electrode may include additional and/or varying features from the description below, and may include any device that one having ordinary skill in the art would consider and/or refer to as a semiconductor device, a substrate, a memory cell, a transistor, a MIM capacitor, and a metal electrode.

In embodiments, the semiconductor device 100 includes a plurality of memory cells, e.g., the memory cell 101, a memory cell 103, a memory cell 105, a memory cell 107, and a memory cell 109, above the substrate 102. The substrate 102 and the plurality of memory cells, e.g., the memory cell 101, the memory cell 103, the memory cell 105, the memory cell 107, and the memory cell 109, may form a three dimensional shape of a rectangular prism, a cuboid, or some other regular shape. FIG. 1(a) shows a semiconductor device 100 at one end of a rectangular prism, while FIG. 1(b) as an opposite end of the semiconductor device 100. Each memory cell, e.g., the memory cell 101, the memory cell 103, the memory cell 105, the memory cell 107, and the memory cell 109 is vertically above the substrate, and in parallel to each other. Any two memory cells are separated by an insulating layer. For example, the memory cell 101 and the memory cell 103 are separated by an insulating layer 113.

In embodiments, the substrate 102 may be oriented in a horizontal direction. The memory cell 101, the memory cell 103, the memory cell 105, the memory cell 107, and the memory cell 109 may be above the substrate 102, oriented in a vertical direction substantially orthogonal to the horizontal direction. In detail, a memory cell oriented in the vertical direction may mean that the memory cell is oriented in a vertical direction substantially perpendicular or orthogonal to the plane defined by the substrate 102 that is oriented in the horizontal direction. A first direction may be substantially perpendicular or orthogonal to a second direction when there is +/−10 degrees of orthogonality between the two directions. For example, the substrate 102 may be in the horizontal direction, while the memory cell 101 may be oriented in a vertical direction above the substrate 102 where the memory cell 101 may form an 80 degree or 100 degree with the horizontal direction. In the following, more details of the memory cell 101 may be provided as an example for any of the memory cells.

In embodiments, as shown in FIG. 1(a), FIG. 1(b), and FIG. 1(c), the memory cell 101 is vertically above the substrate 102. The memory cell 101 includes the MIM capacitor 121 at a lower device portion 120 (dash lines), and the transistor 131 at an upper device portion 130 (dash lines) above the lower device portion 120. The upper device portion 130 and the lower device portion 120 is separated by an insulator layer 111. The transistor 131 may be an NMOS transistor, and may be a TFT above the substrate 102. The transistor 131 and the MIM capacitor 121 may be self-aligned that a shadow of the transistor 131 substantially overlaps with the MIM capacitor 121. Accordingly, the memory cell 101 is placed within the footprint of the transistor 131.

In more detail, as shown in FIG. 1(a), FIG. 1(b), and FIG. 1(c), the transistor 131 includes one or more channel areas, e.g., a channel area 161, a channel area 163; a gate electrode 162 around portions of one or more channel areas; a gate dielectric layer 165 between the gate electrode 162 and the one or more channel areas to separate the gate electrode 162 from the one or more channel areas; a drain electrode 143, and the metal electrode 141 as a source electrode. The source electrode and the drain electrode may be interchangeable. The one or more channel areas, e.g., the channel area 161, the channel area 163, may be nanoribbons, nanowires, or fins, including a channel material, and may have different width, length, or thickness. Furthermore, the transistor 131 may include an epitaxial layer 169 between the metal electrode 141 and the one or more channel areas, e.g., the channel area 161, or the channel area 163, to reduce a resistance between the metal electrode 141 and the one or more channel areas. There may be further insulating materials 167 between the one or more channel areas, e.g., the channel area 161, the channel area 163. The gate electrode 162 may be coupled to a word line, and the drain electrode 143 may be coupled to a bit line.

In embodiments, the MIM capacitor 121 includes the metal electrode 141 as a portion of a first plate, and a second plate 142 separated from the first plate by a capacitor dielectric layer 156. In addition, the first plate of the MIM capacitor 121 includes a first group of metal contacts, e.g., a metal contact 151, a metal contact 153. The first group of metal contacts, e.g., the metal contact 151, the metal contact 153 may be within one or more metal layers above the substrate 102 in a horizontal direction in parallel to a surface of the substrate 102. The metal electrode 141 is coupled to the first group of metal contacts, e.g., the metal contact 151, the metal contact 153, to form the first plate for the MIM capacitor 121. The second plate 142 includes a second group of metal contacts, e.g., a metal contact 152, a metal contact 154, placed within one or more metal layers above the substrate 102 in the horizontal direction. In some embodiments, a metal contact of the first group of metal contacts or the second group of metal contacts has a thickness in a range of about 5 nm to about 30 nm. Two metal contacts of the first group of metal contacts and the second group of metal contacts may have different width, length, or thickness. As shown in FIG. 1(c), the metal contacts in the first group of metal contacts and the second group of metal contacts are of a rectangular shape. In some other embodiments, the metal contacts may include portions of other shapes, e.g., a U-shaped portion, which may increase the area of the plate. Furthermore, there may be more metal contacts in the first group of metal contacts and the second group of metal contacts in more metal layers to increase the capacitance of the MIM capacitor 121. Additionally a higher k dielectric material may be used in the MIM capacitor 121 to increase the capacitance.

In embodiments, other memory cells, e.g., the memory cell 103, the memory cell 105, the memory cell 107, and the memory cell 109, may be similar to the memory cell 101, and may include a MIM capacitor at a lower device portion, a transistor at an upper device portion above the lower device portion. The MIM capacitor may include a metal electrode vertically above the substrate as a portion of a first plate, and the metal electrode is also a source electrode of the transistor.

In embodiments, the gate electrode 162, the drain electrode 143, the metal electrode 141, the second plate 142, the metal contact 151, the metal contact 153, the metal contact 152, or the metal contact 154 may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), cobalt (Co), and an alloy of Ti, Mo, Au, Pt, Al, Ni, Cu, Cr, Co, TiAlN, HfAlN, or InAlO.

In embodiments, the one or more channel areas, e.g., the channel area 161, the channel area 163, may be a n-type doped channel or a p-type doped channel. The channel area 161 or the channel area 163 may include a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

In embodiments, the substrate 102 may be a silicon substrate, a glass substrate, such as soda lime glass or borosilicate glass, a metal substrate, a plastic substrate, or another suitable substrate. Other dielectric layer or other devices may be formed on the substrate 102, not shown for clarity.

In embodiments, the gate dielectric layer 165 may include a high-K dielectric material selected from the group consisting of hafnium silicate, zirconium silicate, hafnium dioxide, zirconium dioxide, aluminum oxide, and nitride hafnium silicate.

In embodiments, the ILD layer may include silicon dioxide ($SiO_2$), carbon doped oxide (CDO), silicon nitride, $O_3$-tetraethylorthosilicate (TEOS), $O_3$-hexamethyldisiloxane (HMDS), plasma-TEOS oxide layer, perfluorocyclobutane, polytetrafluoroethylene, fluorosilicate glass (FSG), organic polymer, silsesquioxane, siloxane, organosilicate glass, or other suitable materials.

Figure 2:
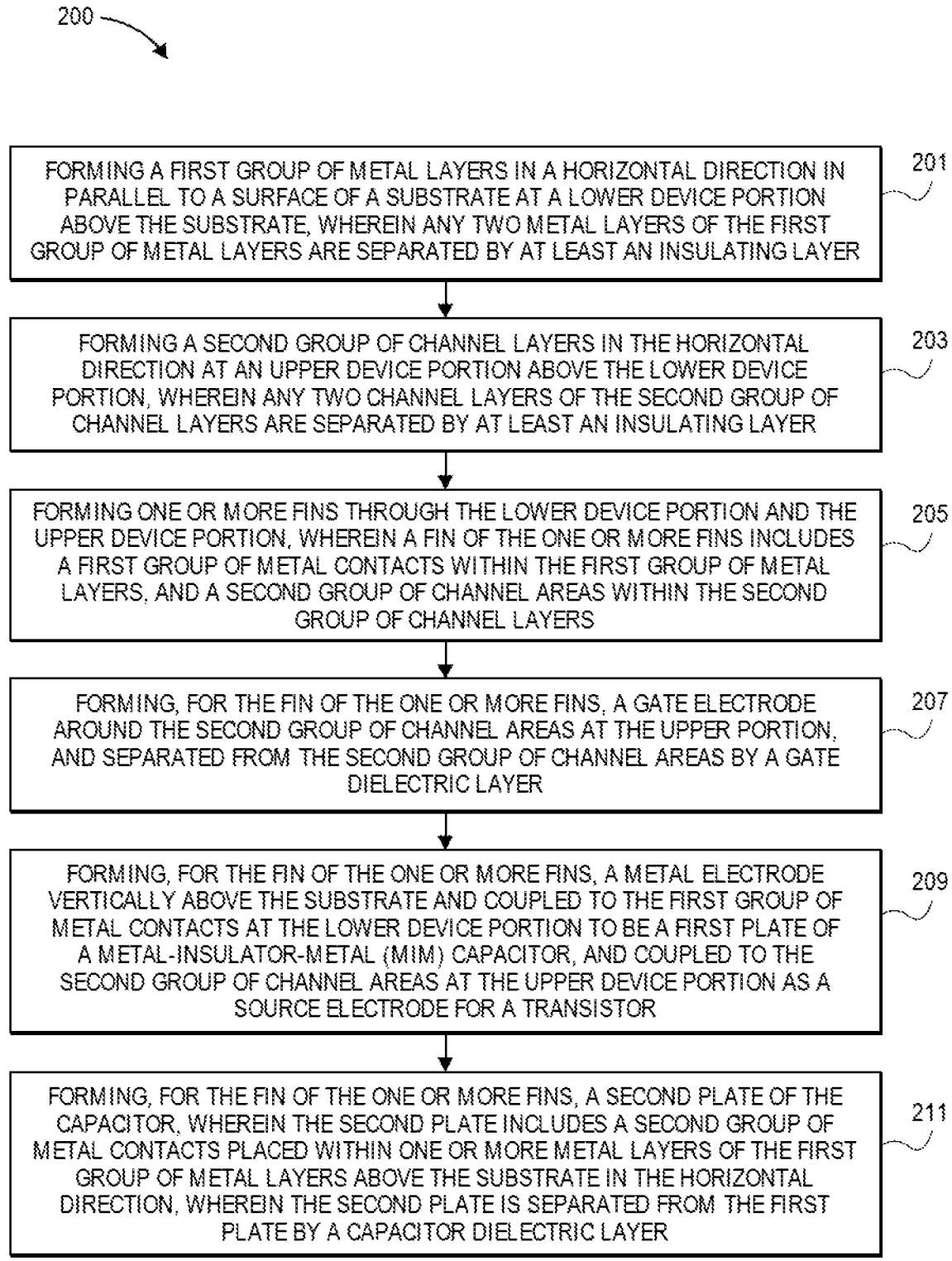
FIG. 2 illustrates a process for forming a semiconductor device including memory cells vertically above a substrate, a memory cell including a transistor and a MIM capacitor with a shared vertical metal electrode, in accordance with some embodiments.

FIG. 2 illustrates a process 200 for forming a semiconductor device including memory cells vertically above a substrate, a memory cell including a transistor and a MIM capacitor with a shared vertical metal electrode, in accordance with some embodiments. More details of the process 200 are illustrated in FIGS. 3(*a*)-3(*f*). In embodiments, the process 200 may be applied to form the semiconductor device 100 including memory cells vertically above a substrate, a memory cell including a transistor and a MIM capacitor with a shared vertical metal electrode, as shown in FIGS. 1(*a*)-1(*c*).

At block 201, the process 200 may include forming a first group of metal layers in a horizontal direction in parallel to a surface of a substrate at a lower device portion above the substrate, wherein any two metal layers of the first group of metal layers are separated by at least an insulating layer. For example, as shown in FIG. 3(*a*), the process 200 may include forming a first group of metal layers, e.g., a metal layer 321, a metal 323, in a horizontal direction in parallel to a surface of a substrate 302 at a lower device portion 320 above the substrate 302. Any two metal layers, e.g., the metal layer 321 and the metal 323 are separated by at least an insulating layer 322.

At block 203, the process 200 may include forming a second group of channel layers in the horizontal direction at an upper device portion above the lower device portion, wherein any two channel layers of the second group of channel layers are separated by at least an insulating layer. In addition, the second group of channel layers is separated from the first group of metal layers by an insulating layer. The insulating layer separating the second group of channel layers from the first group of metal layers may have a material different from the material in the insulating layers separating the second group of channel layers or the first group of metal layers. For example, as shown in FIG. 3(*b*), the process 200 may include forming a second group of channel layers, e.g., a channel layer 331, a channel 333, in the horizontal direction at an upper device portion 330 above the lower device portion 320. Any two channel layers, e.g., the channel layer 331 and the channel 333, are separated by at least an insulating layer, e.g., an insulating layer 332. In embodiments, the forming of the second group of channel layers, e.g., the channel layer 331, the channel 333, may include depositing epitaxial layers as the second group of channel layers, or layer transferring the second group of channel layers. In addition, there is an insulating layer 341 between the channel layers, e.g., the channel layer 331 and the channel 333, and the metal layers, e.g., the metal layer 321 and the metal layer 323.

At block 205, the process 200 may include forming one or more fins through the lower device portion and the upper device portion, wherein a fin of the one or more fins includes a first group of metal contacts within the first group of metal layers, and a second group of channel areas within the second group of channel layers, separated by the insulating layer in between. For example, as shown in FIG. 3(*c*), the process 200 may include forming one or more fins, e.g., a fin 341, a fin 343, a fin 345, and more, through the lower device portion 320 and the upper device portion 330, wherein a fin of the one or more fins, e.g., the fin 341, includes a first group of metal contacts, e.g., a metal contact 361, a metal contact 363, within the first group of metal layers, and a second group of channel areas, e.g., a channel area 351, a channel area 353, within the second group of channel layers.

At block 207, the process 200 may include forming, for the fin of the one or more fins, a gate electrode around the second group of channel areas at the upper portion, and separated from the second group of channel areas by a gate dielectric layer. For example, as shown in FIG. 3(*d*), the process 200 may include forming, for the fin 341, a gate electrode 372 around the second group of channel areas, e.g., the channel area 351, the channel area 353, at the upper portion 330, and separated from the second group of channel areas, e.g., the channel area 351, the channel area 353, by a gate dielectric layer, which is below the gate electrode 372. In embodiments, the process 200 may include removing the insulating layers separating the second group of channel layers before forming the gate electrode 372 around the second group of channel areas at the upper portion 330. The process 200 may also include forming insulating layers to separate the fins, e.g., an insulating layer 313 to separate the fin 341 and the fin 343.

Figure 3A:
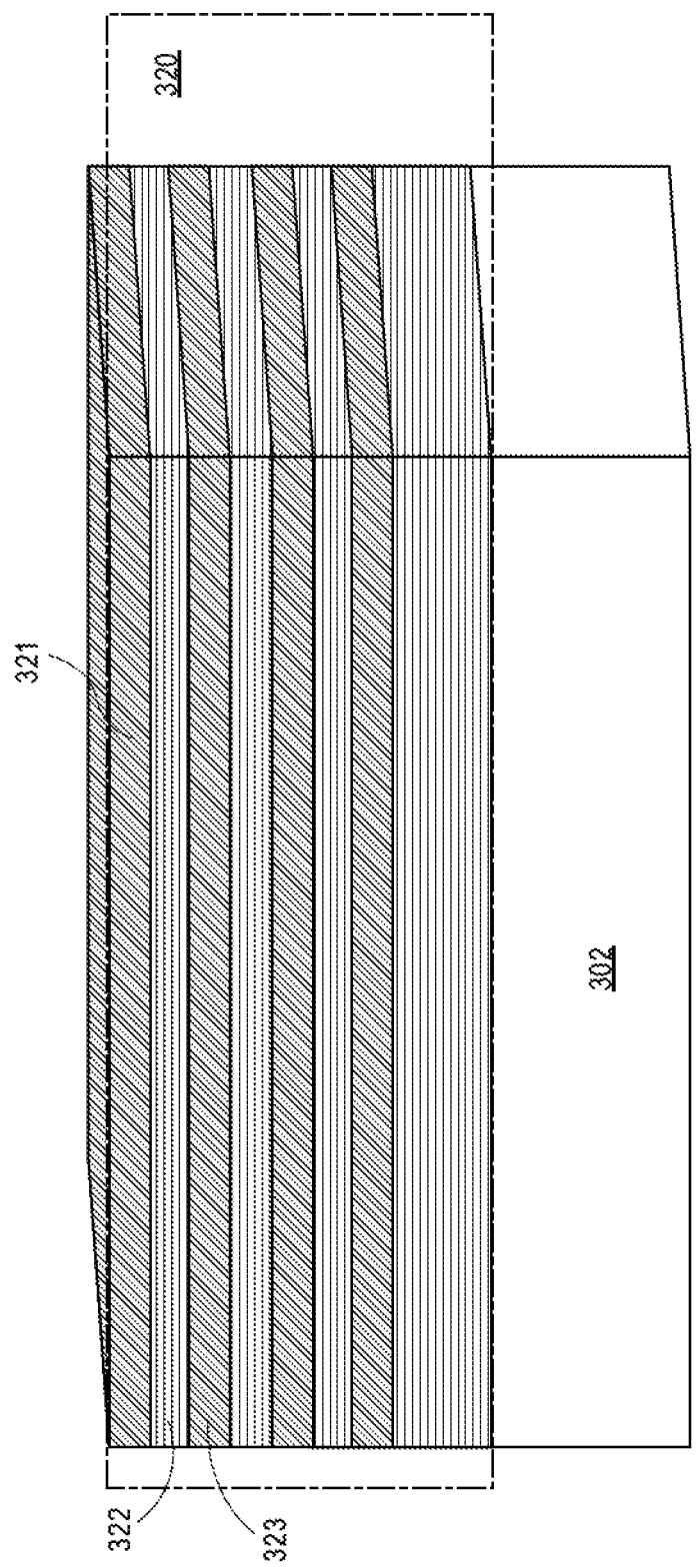
FIGS. 3(a)-3(f) schematically illustrate a process for forming a semiconductor device including memory cells vertically above a substrate, a memory cell including a transistor and a MIM capacitor with a shared vertical metal electrode, in accordance with some embodiments.
Figure 3B:
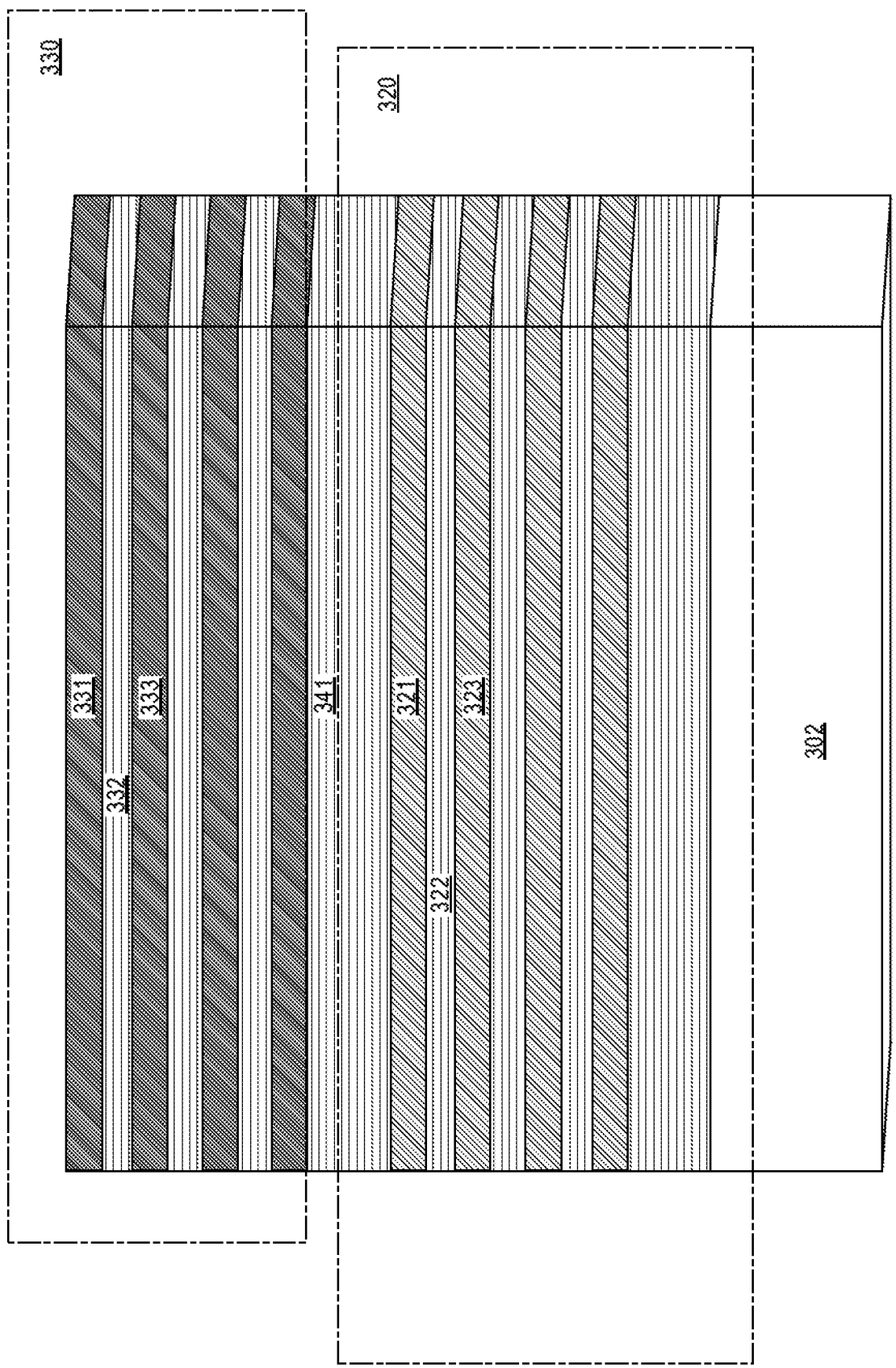
Figure 3C:
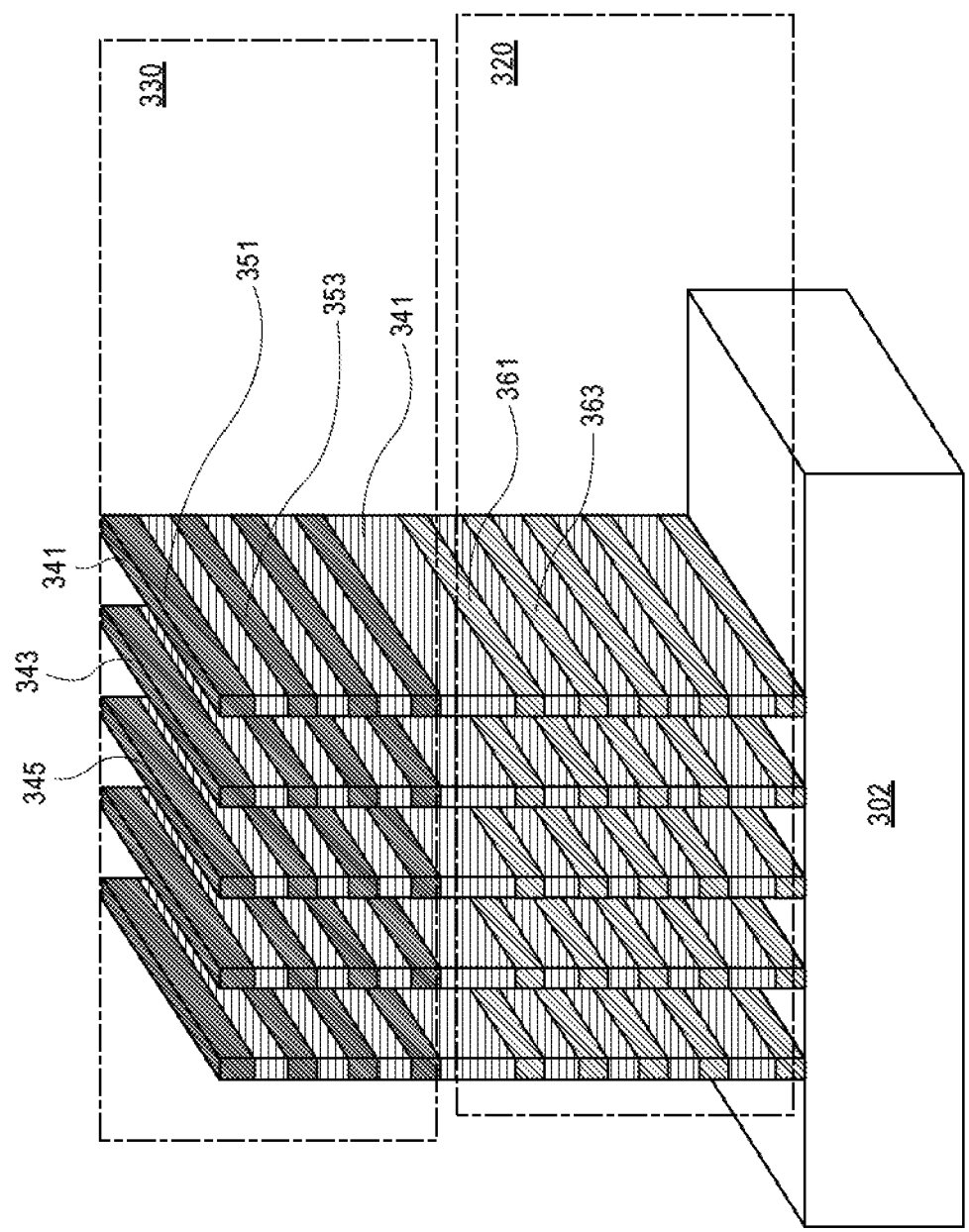
Figure 3D:
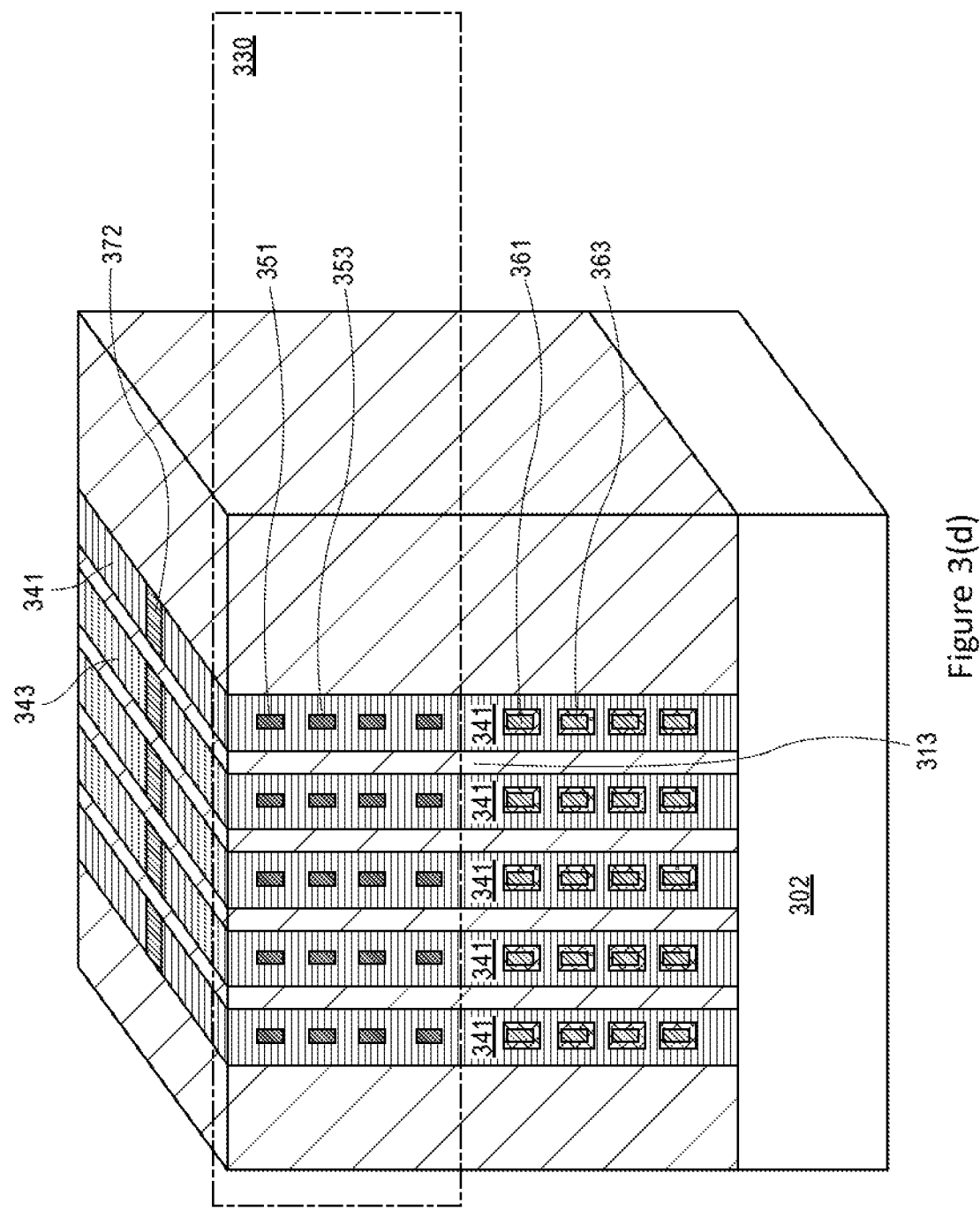
Figure 3E:
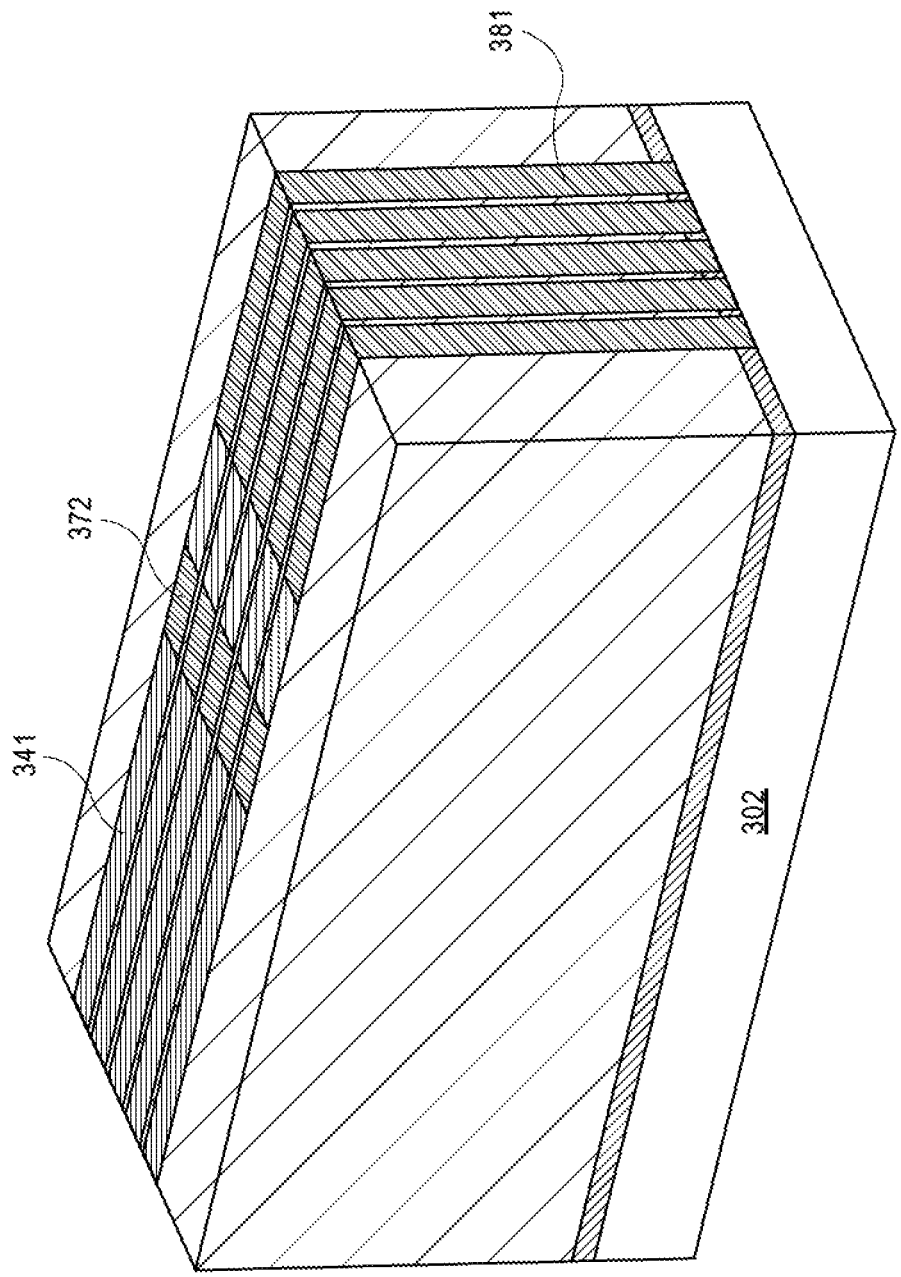

At block 209, the process 200 may include forming, for the fin of the one or more fins, a metal electrode vertically above the substrate and coupled to the first group of metal contacts at the lower device portion to be a first plate of a MIM capacitor, and coupled to the second group of channel areas at the upper device portion as a source electrode for a transistor. For example, as shown in FIG. 3(e), the process 200 may include forming, for the fin 341, a metal electrode 381 vertically above the substrate 302 and coupled to the first group of metal contacts at the lower device portion to be a first plate of a MIM capacitor, and coupled to the second group of channel areas at the upper device portion as a source electrode for a transistor. In embodiments, the process 200 may include inserting an epitaxial layer next to the second group of channel areas before forming the metal electrode vertically above the substrate and coupled to the first group of metal contacts at the lower device portion to be the first plate of the MIM capacitor.

Figure 3F:
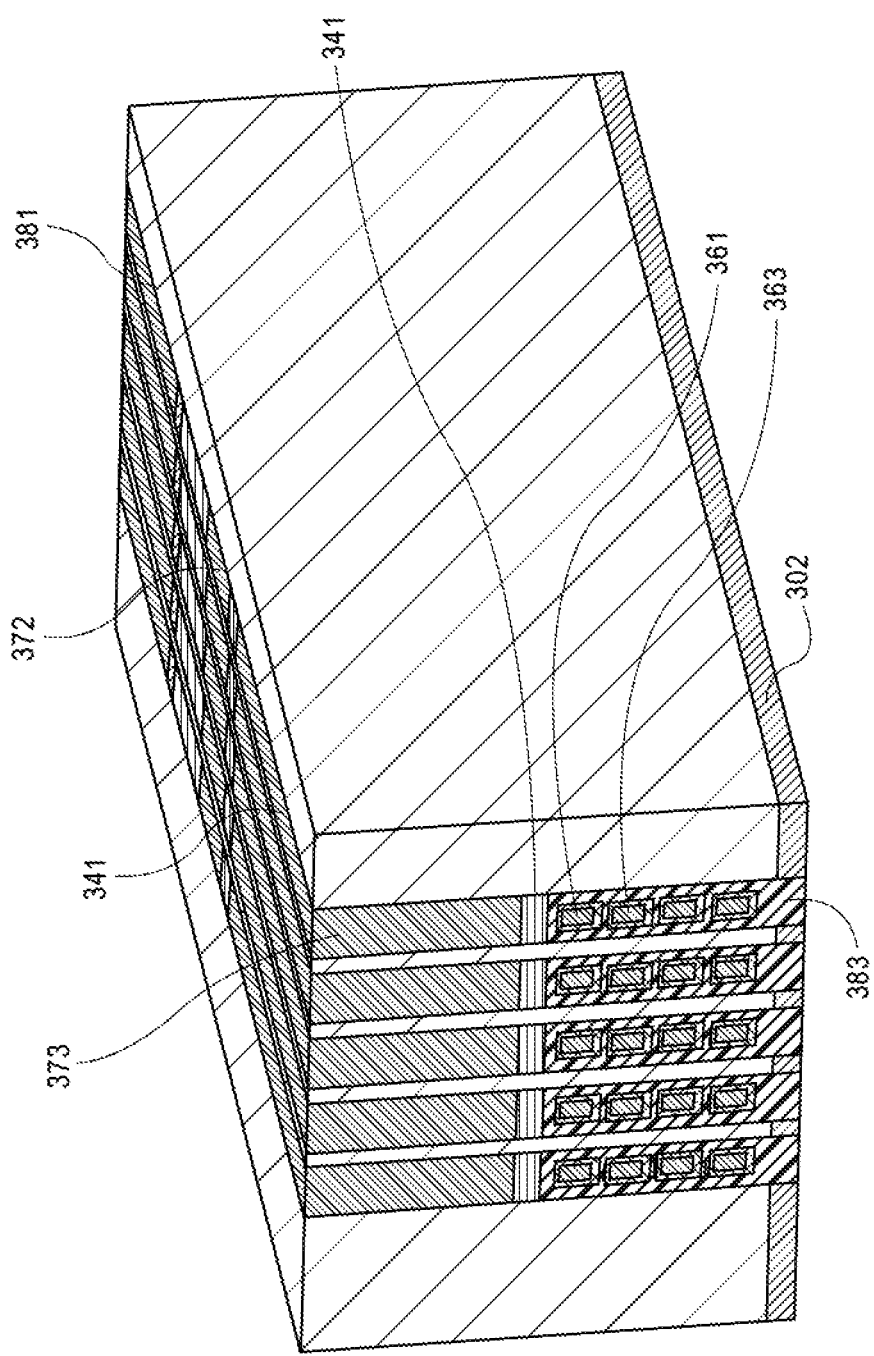

At block 211, the process 200 may include forming, for the fin of the one or more fins, a second plate of the capacitor, wherein the second plate includes a second group of metal contacts placed within one or more metal layers of the first group of metal layers above the substrate in the horizontal direction, wherein the second plate is separated from the first plate by a capacitor dielectric layer. Furthermore, the process 200 may also include forming a drain electrode for the transistor. For example, as shown in FIG. 3(f), the process 200 may include forming, for the fin 341, a second plate 383 of the capacitor, wherein the second plate 383 includes a second group of metal contacts placed within one or more metal layers of the first group of metal layers above the substrate 302 in the horizontal direction, wherein the second plate 383 is separated from the first plate by a capacitor dielectric layer. Furthermore, the process 200 may also include forming a drain electrode 373 for the transistor. In embodiments, the process 200 may include removing the insulating layers to expose the first group of metal contacts within the first group of metal layers, before forming the capacitor dielectric layer and the second plate of the capacitor including the second group of metal contacts placed within one or more metal layers of the first group of metal layers.

In addition, the process 200 may include additional operations to form other layers, e.g., ILD layers, encapsulation layers, insulating layers, not shown.

Figure 4:
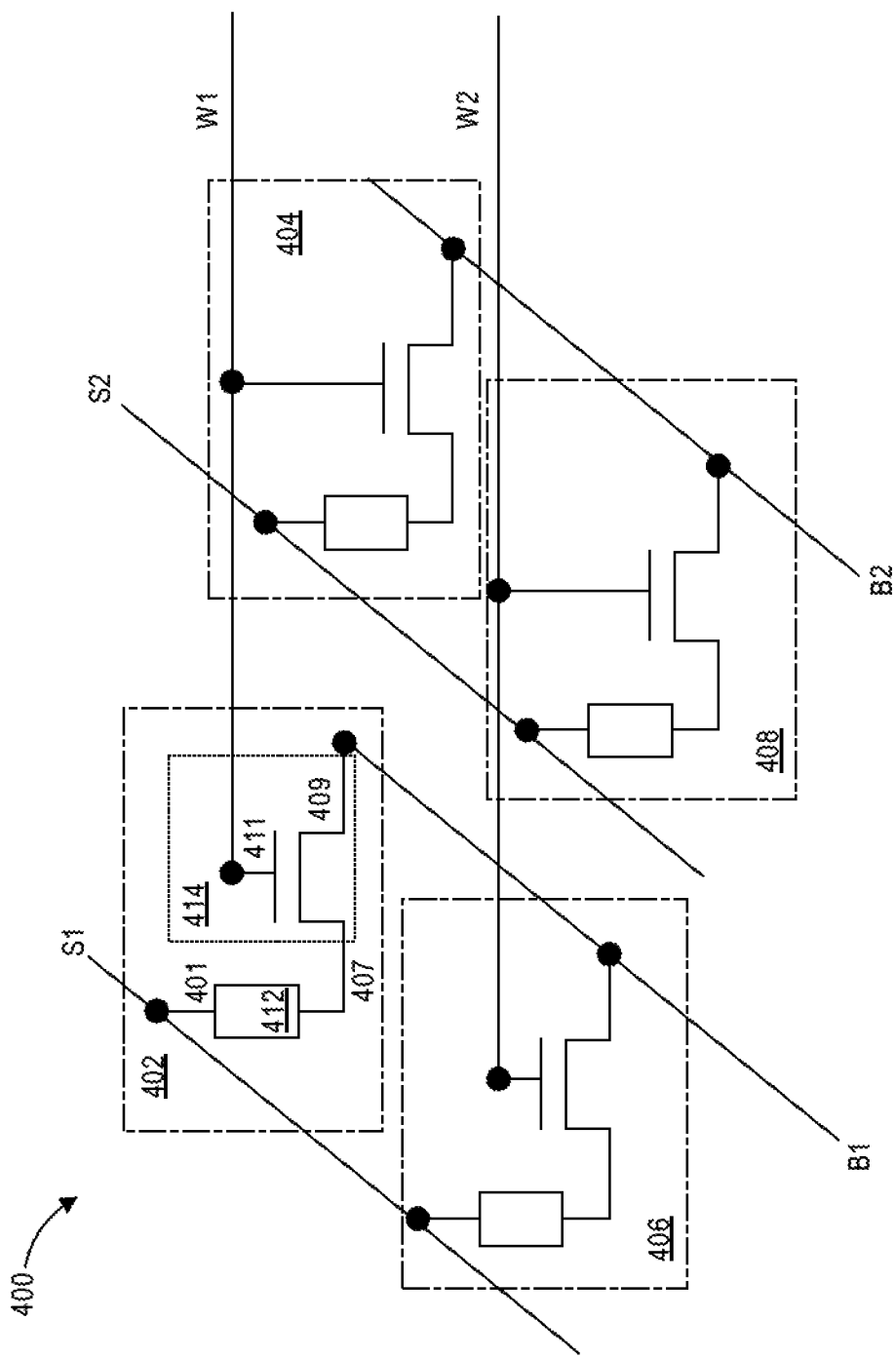
FIG. 4 schematically illustrates a memory array with multiple memory cells, a memory cell including a transistor and a MIM capacitor with a shared vertical metal electrode, in accordance with some embodiments.

FIG. 4 schematically illustrates a memory array 400 with multiple memory cells (e.g., a memory cell 402, a memory cell 404, a memory cell 406, and a memory cell 408), a memory cell including a transistor and a MIM capacitor with a shared vertical metal electrode, in accordance with some embodiments. In embodiments, the memory cell 402, or other memory cells may be an example of the memory cell 101, the memory cell 103, the memory cell 105, the memory cell 107, or the memory cell 109, as shown in FIG. 1(a); or a memory cell formed according to the process 200, as shown in FIG. 2.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 402 may be coupled in series with the other memory cells of the same row, and may be coupled in parallel with the memory cells of the other rows. The memory array 400 may include any suitable number of one or more memory cells.

In embodiments, multiple memory cells, such as the memory cell 402, the memory cell 404, the memory cell 406, and the memory cell 408, may have a similar configuration. For example, the memory cell 402 may include a transistor 414 and a MIM capacitor 412 with a shared vertical metal electrode 407. The memory cell 402 may be controlled through multiple electrical connections to read from the memory cell, write to the memory cell, and/or perform other memory operations.

A transistor 414 may be a selector for the memory cell 402. A word line W1 of the memory array 400 may be coupled to a gate electrode 411 of the transistor 414. When the word line W1 is active, the transistor 414 may select the MIM capacitor 412. A source line S1 of the memory array 400 may be coupled to an electrode 401 of the MIM capacitor 412, while another electrode 407 of the MIM capacitor 412 may be shared with the transistor 414. In addition, a bit line B1 of the memory array 400 may be coupled to another electrode, e.g., an electrode 409 of the transistor 414. The shared electrode 407 may be a source electrode of the transistor 414, while the electrode 409 may be a drain electrode of the transistor 414. A drain electrode and a source electrode may be used interchangeably herein. Additionally, a source line and a bit line may be used interchangeably herein.

In various embodiments, the memory cells and the transistors, e.g., the transistor 414 and the MIM capacitor 412, included in the memory array 400 may be formed in BEOL. Accordingly, the memory array 400 may be formed in higher metal layers, e.g., metal layer 3 and/or metal layer 4, of the integrated circuit above the active substrate region, and may not occupy the active substrate area that is occupied by conventional transistors or memory devices.

Figure 5:
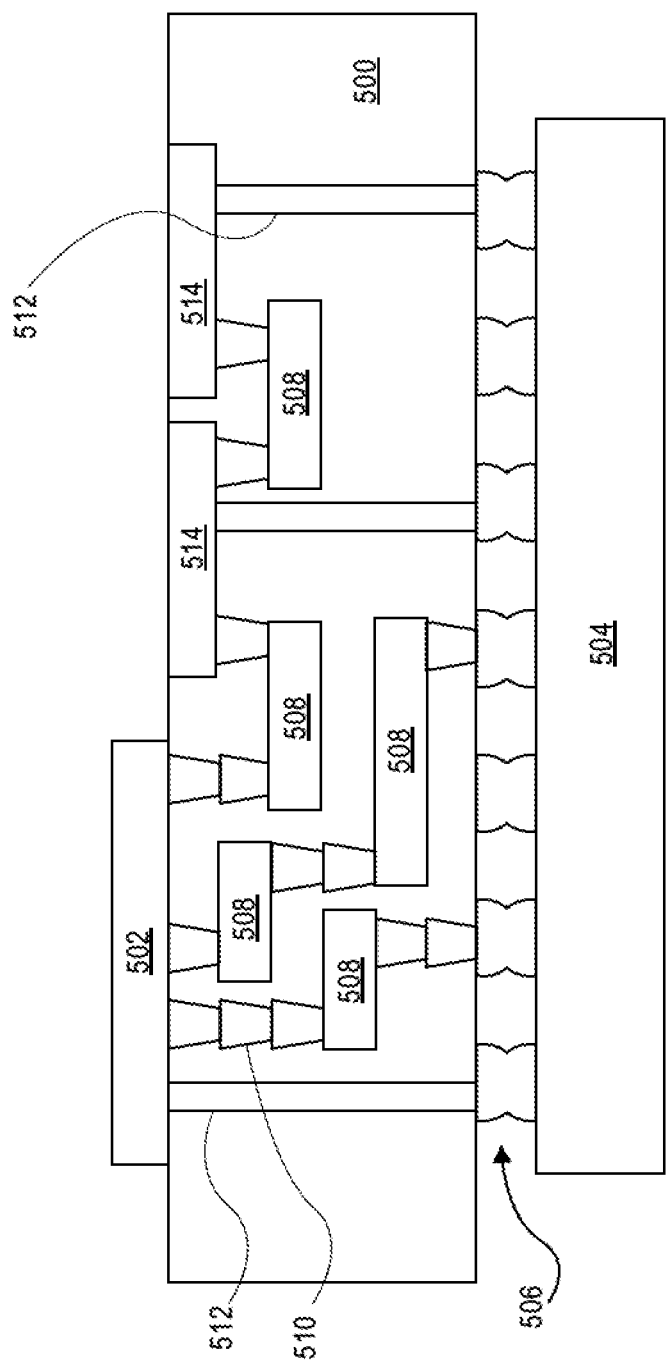
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for a memory cell, e.g., the memory cell 101, the memory cell 103, the memory cell 105, the memory cell 107, or the memory cell 109, as shown in FIG. 1(a); or a memory cell formed according to the process 200, as shown in FIG. 2. The second substrate 504 may be, for instance, a memory module, a computer motherboard, or another integrated circuit die. For example, the second substrate 504 may be a memory module including the memory array 400 as shown in FIG. 4. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
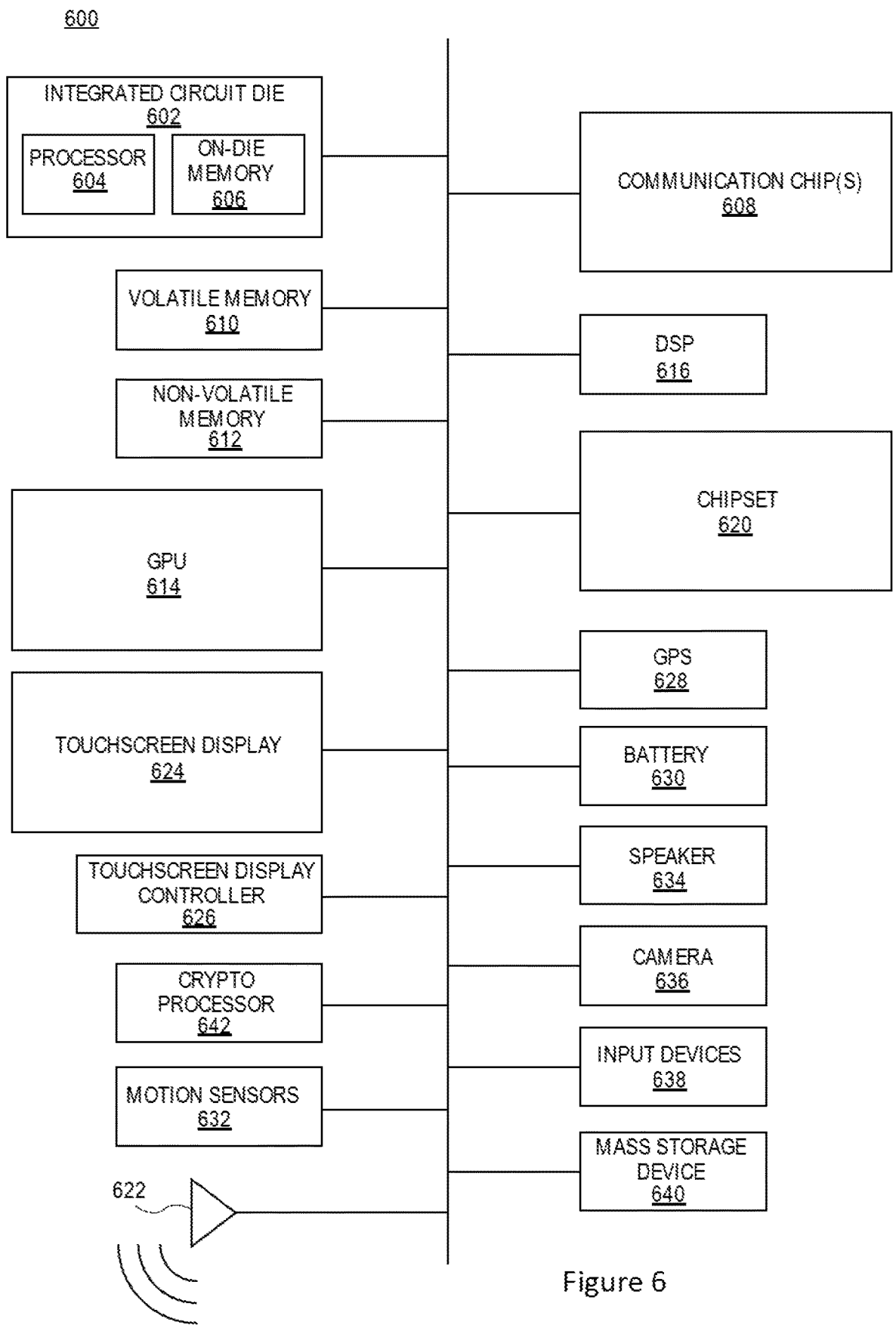
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include the memory cell 101, the memory cell 103, the memory cell 105, the memory cell 107, or the memory cell 109, as shown in FIG. 1(a); or a memory cell formed according to the process 200, as shown in FIG. 2.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the memory cell 101, the memory cell 103, the memory cell 105, the memory cell 107, or the memory cell 109, as shown in FIG. 1(a); or a memory cell formed according to the process 200, as shown in FIG. 2.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

SOME NON-LIMITING EXAMPLES ARE
PROVIDED BELOW

Example 1 may include a semiconductor device, comprising: a memory cell vertically above a substrate, wherein the memory cell includes a metal-insulator-metal (MIM) capacitor at a lower device portion, and a transistor at an upper device portion above the lower device portion; the MIM capacitor includes: a first plate including a first group of metal contacts within one or more metal layers above the substrate in a horizontal direction in parallel to a surface of the substrate, and a metal electrode vertically above the substrate and coupled to the first group of metal contacts; and a second plate including a second group of metal contacts placed within one or more metal layers above the substrate in the horizontal direction, wherein the second plate is separated from the first plate by a capacitor dielectric layer; and the transistor includes: a gate electrode around one or more channel areas and coupled to a word line; the metal electrode of the first plate of the MIM capacitor as a source electrode; and a drain electrode coupled to a bit line.

Example 2 may include the semiconductor device of example 1 and/or some other examples herein, wherein the transistor is an NMOS transistor.

Example 3 may include the semiconductor device of example 1 and/or some other examples herein, wherein the transistor is a thin-film-transistor (TFT) above the substrate.

Example 4 may include the semiconductor device of example 1 and/or some other examples herein, wherein the transistor and the MIM capacitor are self-aligned that a shadow of the transistor substantially overlaps with the MIM capacitor.

Example 5 may include the semiconductor device of example 1 and/or some other examples herein, wherein two metal contacts of the first group of metal contacts and the second group of metal contacts have different width, length, or thickness.

Example 6 may include the semiconductor device of example 1 and/or some other examples herein, wherein a metal contact of the first group of metal contacts or the second group of metal contacts has a thickness in a range of about 5 nm to about 30 nm.

Example 7 may include the semiconductor device of example 1 and/or some other examples herein, wherein the transistor includes one or more nanoribbons, nanowires, or fins in the one or more channel areas of the transistor.

Example 8 may include the semiconductor device of example 7 and/or some other examples herein, wherein the one or more nanoribbons, nanowires, or fins in the one or more channel areas of the transistor have different width, length, or thickness.

Example 9 may include the semiconductor device of example 1 and/or some other examples herein, wherein the transistor further includes: a gate dielectric layer between the gate electrode and the one or more channel areas to separate the gate electrode from the one or more channel areas.

Example 10 may include the semiconductor device of example 9 and/or some other examples herein, wherein gate dielectric layer includes a high-K dielectric material selected from the group consisting of hafnium silicate, zirconium silicate, hafnium dioxide, zirconium dioxide, aluminum oxide, and nitride hafnium silicate.

Example 11 may include the semiconductor device of example 1 and/or some other examples herein, wherein the transistor further includes: an epitaxial layer between the metal electrode of the first plate of the MIM capacitor and the one or more channel areas to reduce a resistance between the metal electrode and the one or more channel areas.

Example 12 may include the semiconductor device of example 1 and/or some other examples herein, wherein the memory cell is a first memory cell, and the semiconductor device further includes a second memory cell vertically above the substrate, in parallel with the first memory cell, and separated from the first memory cell by an insulator layer, wherein the second memory cell includes a MIM capacitor at a lower device portion, a transistor at an upper device portion above the lower device portion, the MIM capacitor includes a metal electrode vertically above the substrate as a portion of a first plate, and the metal electrode is also as a source electrode of the transistor.

Example 13 may include the semiconductor device of example 1 and/or some other examples herein, further includes the substrate below the lower device portion, wherein the substrate includes an III-V substrate, a silicon substrate, a bulk substrate, a glass substrate, a silicon-on-insulator (SOI) substrate, or a partial-depleted SOI substrate.

Example 14 may include the semiconductor device of example 1 and/or some other examples herein, wherein the gate electrode, the source electrode, the drain electrode, the metal electrode, a metal contact of the first group of metal contacts or the second group of metal contacts includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), cobalt (Co), and an alloy of Ti, Mo, Au, Pt, Al, Ni, Cu, Cr, Co, TiAlN, HfAlN, or InAlO.

Example 15 may include the semiconductor device of example 1 and/or some other examples herein, wherein the one or more channel areas includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 16 may include a method for forming a semiconductor device, the method comprising: forming a first group of metal layers in a horizontal direction in parallel to a surface of a substrate at a lower device portion above the substrate, wherein any two metal layers of the first group of metal layers are separated by at least an insulating layer; forming a second group of channel layers in the horizontal direction at an upper device portion above the lower device portion, wherein any two channel layers of the second group of channel layers are separated by at least an insulating layer; forming one or more fins through the lower device portion and the upper device portion, wherein a fin of the one or more fins includes a first group of metal contacts within the first group of metal layers, and a second group of channel areas within the second group of channel layers; forming, for the fin of the one or more fins, a gate electrode around the second group of channel areas at the upper portion, and separated from the second group of channel areas by a gate dielectric layer; forming, for the fin of the one or more fins, a metal electrode vertically above the substrate and coupled to the first group of metal contacts at the lower device portion to be a first plate of a metal-insulator-metal (MIM) capacitor, and coupled to the second group of channel areas at the upper device portion as a source electrode for a transistor; and forming, for the fin of the one or more fins, a second plate of the capacitor, wherein the second plate includes a second group of metal contacts placed within one or more metal layers of the first group of metal layers above the substrate in the horizontal direction, wherein the second plate is separated from the first plate by a capacitor dielectric layer.

Example 17 may include the method of example 16 and/or some other examples herein, wherein the forming the second group of channel layers in the horizontal direction at the upper device portion includes depositing epitaxial layers as the second group of channel layers, or layer transferring the second group of channel layers.

Example 18 may include the method of example 16 and/or some other examples herein, further including: inserting an epitaxial layer next to the second group of channel areas before forming the metal electrode vertically above the substrate and coupled to the first group of metal contacts at the lower device portion to be the first plate of the MIM capacitor.

Example 19 may include the method of example 16 and/or some other examples herein, further including: removing the insulating layers separating the second group of channel layers before forming the gate electrode around the second group of channel areas at the upper portion.

Example 20 may include the method of example 16 and/or some other examples herein, further including: removing the insulating layers to expose the first group of metal contacts within the first group of metal layers, before forming the capacitor dielectric layer and the second plate of the capacitor including the second group of metal contacts placed within one or more metal layers of the first group of metal layers.

Example 21 may include a computing device, comprising: a circuit board; and a memory device coupled to the circuit board and including a memory array, wherein the memory array includes a plurality of memory cells vertically above a substrate, a memory cell of the plurality of memory cells includes a metal-insulator-metal (MIM) capacitor at a lower device portion, and a transistor at an upper device portion above the lower device portion; wherein the MIM capacitor includes: a first plate including a first group of metal contacts within one or more metal layers above the substrate in a horizontal direction in parallel to a surface of the substrate, and a metal electrode vertically above the substrate and coupled to the first group of metal contacts; and a second plate including a second group of metal contacts placed within one or more metal layers above the substrate in the horizontal direction, wherein the second plate is separated from the first plate by a capacitor dielectric layer; and the transistor includes: a gate electrode around one or more channel areas and coupled to a word line; the metal electrode of the first plate of the MIM capacitor as a source electrode; and a drain electrode coupled to a bit line.

Example 22 may include computing device of example 21 and/or some other examples herein, wherein the transistor is a thin-film-transistor (TFT) above the substrate.

Example 23 may include computing device of example 21 and/or some other examples herein, wherein the transistor and the MIM capacitor are self-aligned that a shadow of the transistor substantially overlaps with the MIM capacitor.

Example 24 may include computing device of example 21 and/or some other examples herein, wherein the transistor includes one or more nanoribbons, nanowires, or fins in the one or more channel areas of the transistor.

Example 25 may include computing device of example 21 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a memory cell vertically above a substrate, wherein the memory cell includes a metal-insulator-metal (MIM) capacitor at a lower device portion, and a transistor at an upper device portion above the lower device portion;
the MIM capacitor includes:
a first plate including a first group of metal contacts within one or more metal layers above the substrate in a horizontal direction in parallel to a surface of the substrate, and a metal electrode vertically above the substrate and coupled to the first group of metal contacts; and
a second plate including a second group of metal contacts placed within one or more metal layers above the substrate in the horizontal direction, wherein the second plate is separated from the first plate by a capacitor dielectric layer; and
the transistor includes:
a gate electrode around one or more channel areas and coupled to a word line;

the metal electrode of the first plate of the MIM capacitor as a source electrode; and
a drain electrode coupled to a bit line.

2. The semiconductor device of claim 1, wherein the one or more channel areas includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

3. The semiconductor device of claim 1, wherein the gate electrode, the source electrode, the drain electrode, the metal electrode, a metal contact of the first group of metal contacts or the second group of metal contacts includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), cobalt (Co), and an alloy of Ti, Mo, Au, Pt, Al, Ni, Cu, Cr, Co, TiAlN, HfAlN, or InAlO.

4. The semiconductor device of claim 1, wherein the memory cell is a first memory cell, and the semiconductor device further includes a second memory cell vertically above the substrate, in parallel with the first memory cell, and separated from the first memory cell by an insulator layer, wherein the second memory cell includes a MIM capacitor at a lower device portion, a transistor at an upper device portion above the lower device portion, the MIM capacitor includes a metal electrode vertically above the substrate as a portion of a first plate, and the metal electrode is also as a source electrode of the transistor.

5. The semiconductor device of claim 1, wherein the transistor further includes:
an epitaxial layer between the metal electrode of the first plate of the MIM capacitor and the one or more channel areas to reduce a resistance between the metal electrode and the one or more channel areas.

6. The semiconductor device of claim 1, further includes the substrate below the lower device portion, wherein the substrate includes an III-V substrate, a silicon substrate, a bulk substrate, a glass substrate, a silicon-on-insulator (SOI) substrate, or a partial-depleted SOI substrate.

7. The semiconductor device of claim 1, wherein the transistor and the MIM capacitor are self-aligned that a shadow of the transistor substantially overlaps with the MIM capacitor.

8. The semiconductor device of claim 1, wherein a metal contact of the first group of metal contacts or the second group of metal contacts has a thickness in a range of about 5 nm to about 30 nm.

9. The semiconductor device of claim 1, wherein two metal contacts of the first group of metal contacts and the second group of metal contacts have different width, length, or thickness.

10. The semiconductor device of claim 1, wherein the transistor is a thin-film-transistor (TFT) above the substrate.

11. The semiconductor device of claim 1, wherein the transistor is an NMOS transistor.

12. The semiconductor device of claim 1, wherein the transistor further includes:
a gate dielectric layer between the gate electrode and the one or more channel areas to separate the gate electrode from the one or more channel areas.

13. The semiconductor device of claim 12, wherein gate dielectric layer includes a high-K dielectric material selected from the group consisting of hafnium silicate, zirconium silicate, hafnium dioxide, zirconium dioxide, aluminum oxide, and nitride hafnium silicate.

14. The semiconductor device of claim 1, wherein the transistor includes one or more nanoribbons, nanowires, or fins in the one or more channel areas of the transistor.

15. The semiconductor device of claim 14, wherein the one or more nanoribbons, nanowires, or fins in the one or more channel areas of the transistor have different width, length, or thickness.

16. A computing device, comprising:
a circuit board; and
a memory device coupled to the circuit board and including a memory array, wherein the memory array includes a plurality of memory cells vertically above a substrate, a memory cell of the plurality of memory cells includes a metal-insulator-metal (MIM) capacitor at a lower device portion, and a transistor at an upper device portion above the lower device portion; wherein
the MIM capacitor includes:
a first plate including a first group of metal contacts within one or more metal layers above the substrate in a horizontal direction in parallel to a surface of the substrate, and a metal electrode vertically above the substrate and coupled to the first group of metal contacts; and
a second plate including a second group of metal contacts placed within one or more metal layers above the substrate in the horizontal direction, wherein the second plate is separated from the first plate by a capacitor dielectric layer; and
the transistor includes:
a gate electrode around one or more channel areas and coupled to a word line;
the metal electrode of the first plate of the MIM capacitor as a source electrode; and
a drain electrode coupled to a bit line.

17. The computing device of claim 16, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

18. The computing device of claim 16, wherein the transistor and the MIM capacitor are self-aligned that a shadow of the transistor substantially overlaps with the MIM capacitor.

19. The computing device of claim 16, wherein the transistor includes one or more nanoribbons, nanowires, or fins in the one or more channel areas of the transistor.

20. The computing device of claim 16, wherein the transistor is a thin-film-transistor (TFT) above the substrate.

* * * * *